United States Patent
Chang et al.

(10) Patent No.: US 9,502,561 B1
(45) Date of Patent: Nov. 22, 2016

(54) SEMICONDUCTOR DEVICES AND METHODS OF FORMING THE SAME

(71) Applicant: TAIWAN SEMICONDUCTOR MANUFACTURING CO., LTD., Hsinchu (TW)

(72) Inventors: Chih-Chiang Chang, Hsinchu County (TW); Hsueh-Chang Sung, Hsinchu County (TW); Kun-Mu Li, Hsinchu County (TW); Ming-Hua Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/925,670

(22) Filed: Oct. 28, 2015

(51) Int. Cl.
  *H01L 29/78* (2006.01)
  *H01L 29/165* (2006.01)
  *H01L 29/161* (2006.01)
  *H01L 29/16* (2006.01)
  *H01L 29/66* (2006.01)
  *H01L 29/06* (2006.01)

(52) U.S. Cl.
  CPC ....... *H01L 29/7848* (2013.01); *H01L 29/0657* (2013.01); *H01L 29/161* (2013.01); *H01L 29/165* (2013.01); *H01L 29/1608* (2013.01); *H01L 29/66795* (2013.01); *H01L 29/785* (2013.01)

(58) Field of Classification Search
  CPC ........... H01L 29/0657; H01L 29/1608; H01L 29/161; H01L 29/165; H01L 29/66795; H01L 29/785; H01L 29/7848
  See application file for complete search history.

(56) References Cited

U.S. PATENT DOCUMENTS

| | | | |
|---|---|---|---|
| 8,906,768 B2 * | 12/2014 | Wong | H01L 29/785 438/157 |
| 9,136,383 B2 * | 9/2015 | Wann | H01L 29/41791 |
| 9,275,905 B1 * | 3/2016 | Wen | H01L 21/845 |
| 2013/0234215 A1 * | 9/2013 | Okano | H01L 29/42392 257/255 |
| 2014/0042500 A1 * | 2/2014 | Wann | H01L 29/41791 257/288 |
| 2016/0071952 A1 * | 3/2016 | Yin | H01L 29/66492 438/283 |
| 2016/0155845 A1 * | 6/2016 | Breil | H01L 29/7843 257/347 |
| 2016/0197075 A1 * | 7/2016 | Li | H01L 27/0924 257/369 |
| 2016/0204105 A1 * | 7/2016 | Zeng | H01L 27/0886 257/401 |

* cited by examiner

*Primary Examiner* — Allan R Wilson
(74) *Attorney, Agent, or Firm* — Maschoff Brennan (57) ABSTRACT

An embodiment is a semiconductor device, comprising: a substrate; a plurality of fin structures disposed on the substrate; a plurality of first strained materials disposed on each of the plurality of the fin structures; a plurality of cap layers individually formed on each of the plurality of first strained materials, wherein at least two cap layers are connected to each other; a second strained material disposed on the at least two cap layers which are connected to each other.

20 Claims, 7 Drawing Sheets

SEMICONDUCTOR DEVICES AND METHODS OF FORMING THE SAME

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). Similar to planar transistors, source and drain silicides may be formed on the source and drain regions of FinFETs. However, since the fins of FinFETs are typically narrow, current crowding may occur. In addition, it is difficult to land contact plugs onto the source/drain portions of fins. Epitaxy semiconductor layers are thus formed on the fins to increase their volumes using epitaxy processes. A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides.

It was found that trained materials in recessed source/drain (S/D) portions of the FinFET utilizing selectively grown silicon germanium (SiGe) may enhance carrier mobility. The stress effects improve charge mobility through the channel, thereby improving device performance. However, there are challenges to implementation of such features and processes in complementary metal-oxide-semiconductor (CMOS) fabrication. For example, strained material volume is one of the key knobs to increase channel strain, and it is limited by fin critical dimension, fin profile and fin pitch. For device boosting, strained material volume is preferably as large as possible.

Accordingly, what are needed are an improved device and a method for fabricating a strained structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. Similarly, terms such as "front side" and "back side" may be used herein to more easily identify various components, and may identify that those components are, for example, on opposing sides of another component. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various embodiments. Intermediate stages of forming FinFETs are illustrated. Some embodiments discussed herein are discussed in the context of FinFETs formed using a gate-last process. In other embodiments, a gate-first process may be used. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

Before addressing the illustrated embodiments specifically, certain advantageous features and aspects of the present disclosed embodiments will be addressed generally. In general terms, the present disclosure is a semiconductor device and method of forming the same to provide a simple and cost-effective process flow to achieve an strained material in recessed source/drain (S/D) portions of the FinFET utilizing selectively grown silicon germanium (SiGe) to enhance carrier mobility. The stress effects improve charge mobility through the channel, thereby improving device performance. In particular, embodiments such as those disclosed below include an increased volume of strained material for a semiconductor device to achieve performance improvements and enhancements.

The volume of strained material is limited by Fin CD (critical dimension), Fin profile and Fin pitch. For device boosting, the volume of strained material should be as large as possible; however, for memory regions, the increased volume would result in unwanted connection of two adjacent memory devices, and thereby reduce the yield. Thus, there is typically a trade-off between performance improvement for the device region and product yield for the memory region. To reduce the trade-off, in some embodiments of the disclosure, the volume of the strained material in the device region is increased for improved performance, while the volume of the strained material in the memory region is suppressed to avoid unwanted connection for improved yield.

Figure 1:
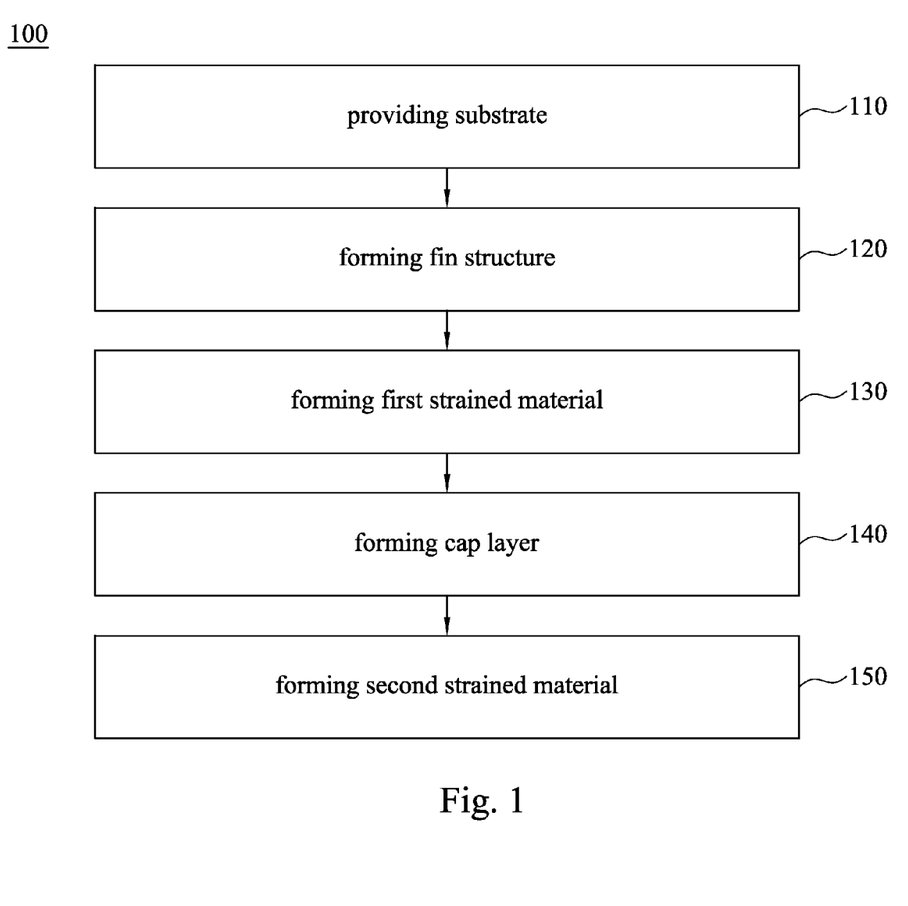
FIG. 1 is a flowchart of a method for fabricating a semiconductor device according to aspects of the present disclosure.
Figure 6:
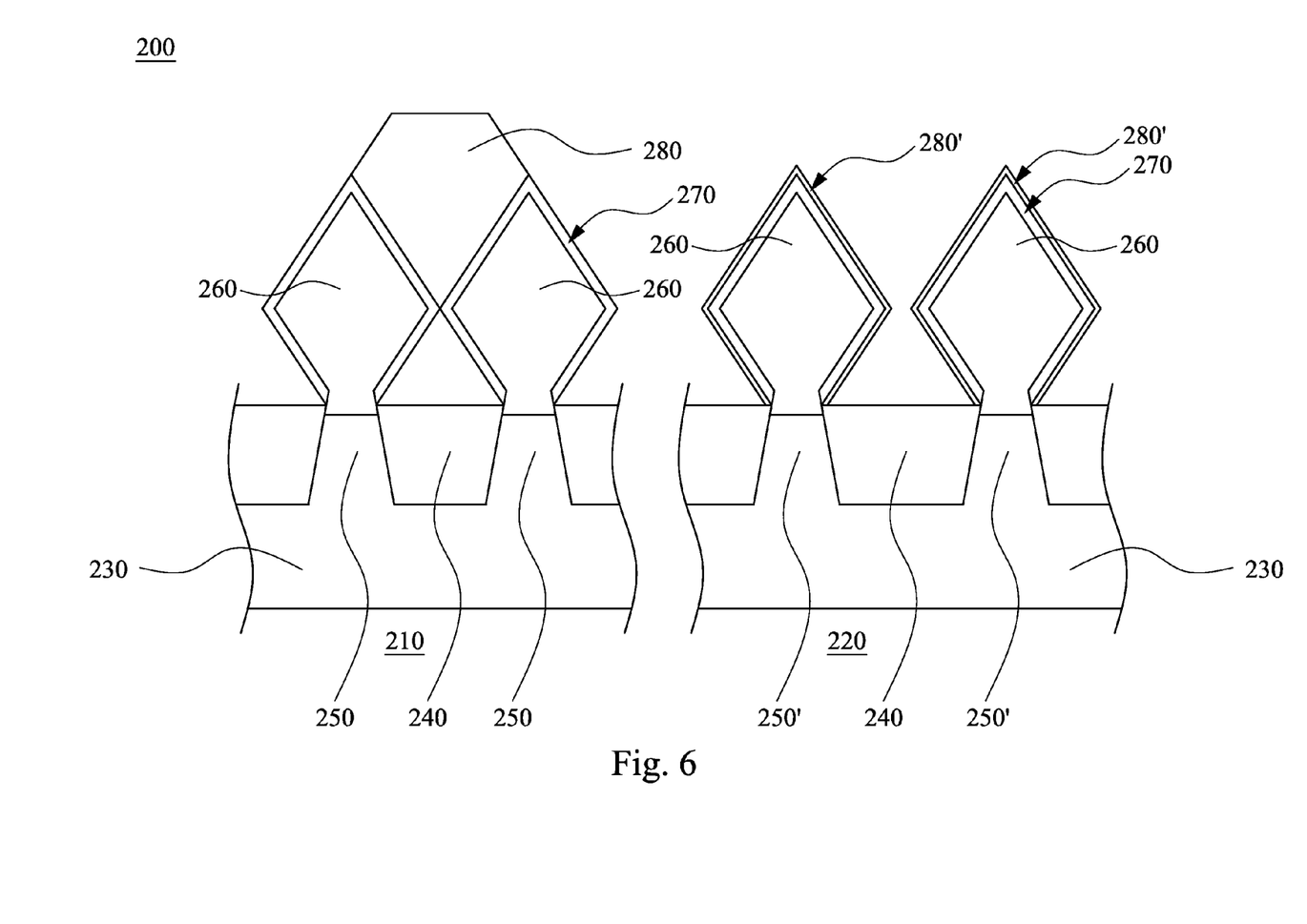
Figure 7:
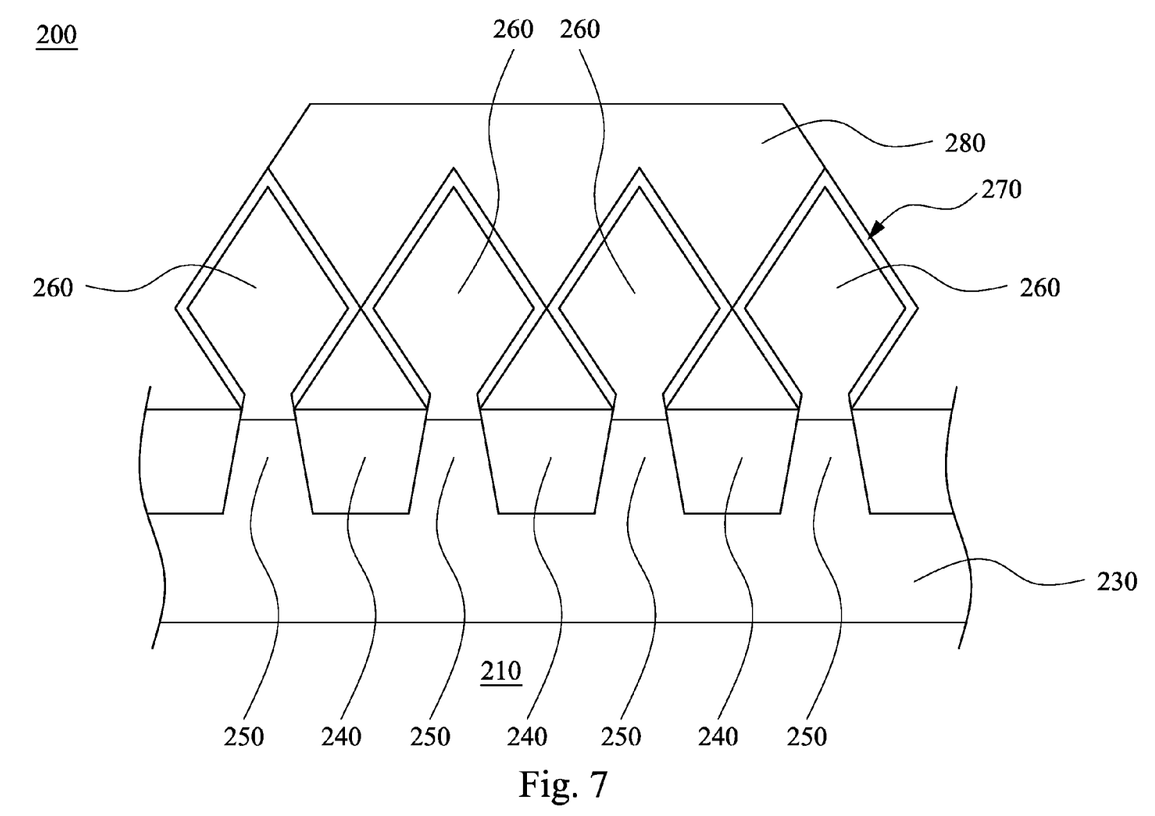

FIG. 1 is a flowchart of a method for fabricating a semiconductor device according to aspects of the present disclosure. FIGS. 2-5 are cross-sectional views of intermediate stages in the manufacturing of semiconductor devices in accordance with some embodiments of the present disclosure. FIGS. 6-7 are cross-sectional views of aspects of semiconductor devices in accordance with some embodiments of the present disclosure. The method 100 and the semiconductor 200 are collectively described with reference to FIG. 1 through 6. It is understood that additional steps can be provided before, during, and after the method 100, and some of the steps described can be replaced or eliminated for other embodiments of the method.

Figure 2:
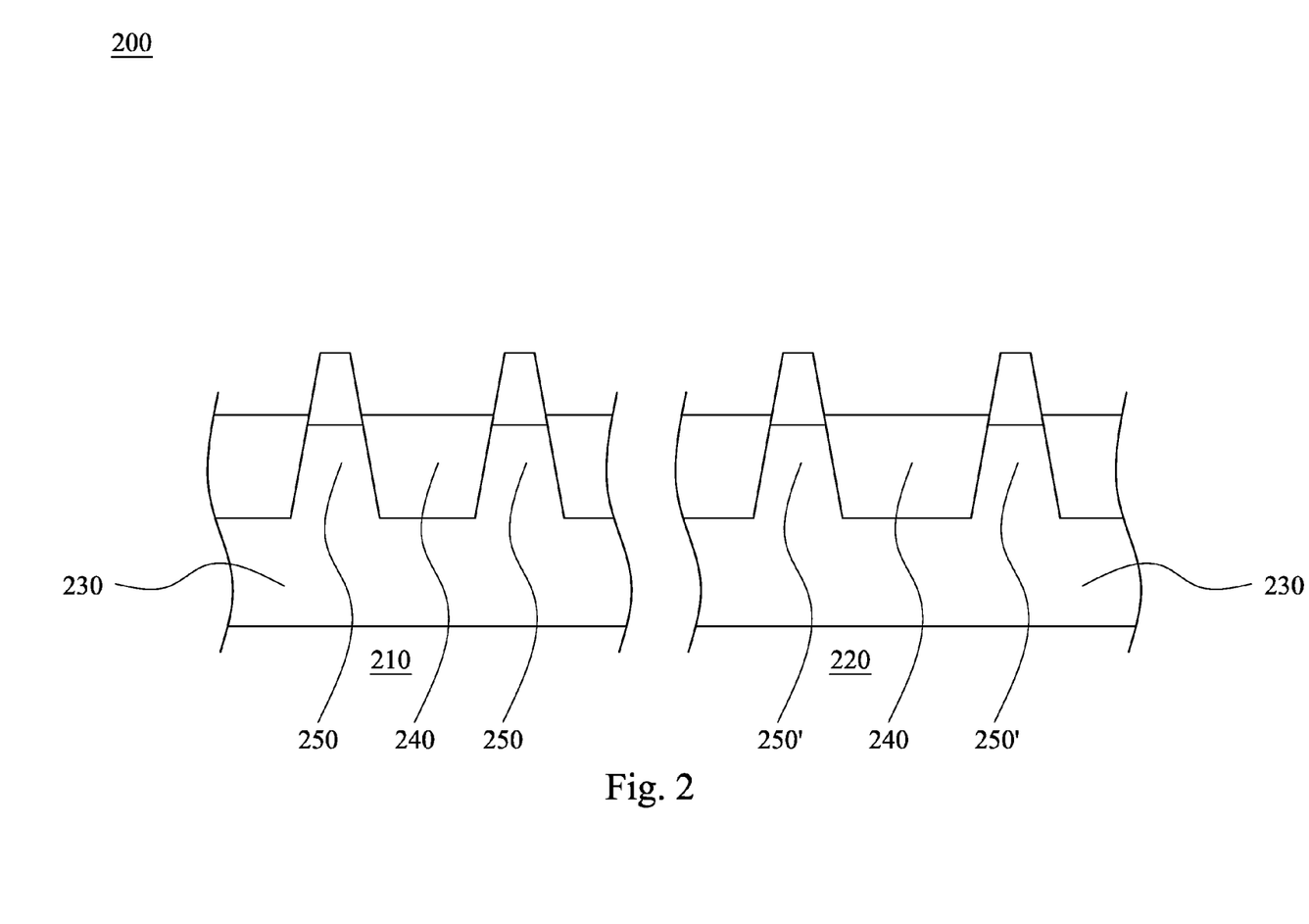
FIGS. 2-7 are cross-sectional views of intermediate stages in the manufacturing of semiconductor devices in accordance with some embodiments.

The method 100 for fabricating a semiconductor device 200 begins with step 110 in which a substrate 230 including a first region 210 and a second region 220 is provided. In some embodiments, the first region 210 is device region and the second region is a memory region, such as a static random-access memory (SRAM) region. As illustrated in FIG. 2, the semiconductor 200 includes a substrate 230. The substrate 230 may be a bulk silicon substrate. Alternatively, the substrate 230 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 230 also include a silicon-on-insulator (SOI) substrate. SOI substrates are fabricated using separation by implantation of oxygen (SIMOX), wafer bonding, and/or other suitable methods. In addition, the substrate 230 may be doped with a p-type or an n-type impurity. The doped regions are doped with p-type dopants, such as boron or BF2; n-type dopants, such as phosphorus or arsenic; or combinations thereof. The substrate 230 may include various doped regions depending on design requirements as known in the art (e.g., p-type wells or n-type wells). The doped regions may be formed directly on the substrate 230, in a P-well structure, in an N-well structure, in a dual-well structure, or using a raised structure. The semiconductor substrate 230 may further include various active regions, such as regions configured for an N-type metal-oxide-semiconductor transistor device and regions configured for a P-type metal-oxide-semiconductor transistor device.

Some exemplary substrates 230 include isolation regions. The isolation regions comprise any suitable material, including silicon oxide, sapphire, other suitable insulating materials, and/or combinations thereof. As show in FIG. 2, exemplary isolation regions 240 are formed on the substrate 230 to isolate active regions of the substrate 230. The isolation regions 240 utilize isolation technology, such as shallow trench isolation (STI), to define and electrically isolate the various regions. The isolation regions 240 comprise silicon oxide, silicon nitride, silicon oxynitride, an air gap, other suitable materials, or combinations thereof. The isolation regions may be formed by any suitable process, such as implantation (e.g., SIMOX), oxidation, deposition, and/or other suitable process. As one example, the formation of an STI includes a photolithography process, etching a trench in the substrate (for example, by using a dry etching and/or wet etching), and filling the trench (for example, by using a chemical vapor deposition process) with one or more dielectric materials. The trenches may be partially filled, as in the present embodiment, where the substrate remaining between trenches forms a fin structure. In some examples, the filled trench may have a multi-layer structure such as a thermal oxide liner layer filled with silicon nitride or silicon oxide. An exemplary insulator layer may be a buried oxide layer (BOX). In some exemplary semiconductor device 200, the isolation regions 240 are a component (e.g., layer) of a silicon-on-insulator (SOI).

Referring to FIG. 2, the fin structures 250, 250' may be formed by removing top portions of the isolation regions 240, so that a portion of substrate 230 between neighboring the isolation regions 240 becomes the fin structures 250, 250' (step 120). Alternatively, the fin structures 250, 250' may be formed on top of substrate 230 by an epitaxial growth. In some embodiments, the semiconductor device 200 comprises a plurality of the fin structures 204. The fin structures 250, 250' may also include various doped regions. For example, various doped regions can comprise lightly doped source/drain (LDD) regions and source/drain (S/D) regions (also referred to as heavily doped S/D regions). An implantation process (i.e., a junction implant) is performed to form S/D regions. The implantation process utilizes any suitable doping species. The doping species may depend on the type of device being fabricated, such as an NMOS or PMOS device. For example, the S/D regions are doped with p-type dopants, such as boron or BF2; n-type dopants, such as phosphorus or arsenic; and/or combinations thereof. The S/D regions may comprise various doping profiles. One or more annealing processes may be performed to activate the S/D regions. The annealing processes comprise rapid thermal annealing (RTA) and/or laser annealing processes. The fin structure 250, 250' are formed by any suitable process including various deposition, photolithography, and/or etching processes. An exemplary photolithography process includes forming a photoresist layer (resist) overlying the substrate (e.g., on a silicon layer), exposing the resist to a pattern, performing a post-exposure bake process, and developing the resist to form a masking element including the resist. The masking element is then used to etch the fin structure into the silicon layer. Area not protected by the masking element is etched using reactive ion etching (RIE) processes and/or other suitable processes. In an example, the fin structures 250, 250' are formed by patterning and etching a portion of the substrate 230. In another example, the fin structures 250, 250' are formed by patterning and etching a silicon layer deposited overlying an insulator layer (for example, an upper silicon layer of a silicon-insulator-silicon stack of an SOI substrate). As an alternative to traditional photolithography, the fin structures 250, 250' can be formed by a double-patterning lithography (DPL) process. DPL is a method of constructing a pattern on a substrate by dividing the pattern into two interleaved patterns. DPL allows enhanced feature (e.g., fin) density. Various DPL methodologies include double exposure (e.g., using two mask sets), forming spacers adjacent features and removing the features to provide a pattern of spacers, resist freezing, and/or other suitable processes. It is understood that multiple parallel fin structures 250, 250' may be formed in a similar manner. As shown in FIG. 2, in some embodiments according to the present disclosure, a plurality of first fin structures 250 disposed on a first region 210 of the substrate 230, and a plurality of second fin structures 250' disposed on a second region 220 of the substrate 230, wherein a first pitch P1 of the first fin structures 250 is less than a second pitch P2 of the second fin structures 250'. Suitable materials for forming the fin structures 250, 250' include silicon and silicon germanium.

One or more gate structures (not shown) are formed over the substrate 230, including over a portion of the fin structures 250, 250'. The gate structure comprises a gate stack and may include a sealing layer and other suitable structures. The gate stack has an interfacial layer (not shown), a gate dielectric layer (not shown), a gate electrode layer (not shown), and a hard mask layer (not shown). It is understood that the gate stack may comprise additional layers such as interfacial layers, cap layers, diffusion/barrier layers, dielectric layers, conductive layers, other suitable layers, and/or combinations thereof. The interfacial layer of the gate structure is formed over the substrate 230 and the fin structures 250, 250'. The interfacial layer is formed by any suitable process to any suitable thickness. An exemplary interfacial layer includes silicon oxide (e.g., thermal oxide or chemical oxide) and/or silicon oxynitride (SiON).

The gate dielectric layer is formed over the interfacial layer by any suitable process. The gate dielectric layer comprises a dielectric material, such as silicon oxide, silicon nitride, silicon oxynitride, high-k dielectric material, other suitable dielectric material, and/or combinations thereof. Examples of high-k dielectric material includes HfO2, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof.

The gate electrode layer is formed over the gate dielectric layer by any suitable process, and a mask layer (not shown) is formed over the gate layer. The gate electrode layer includes any suitable material, such as polysilicon, aluminum, copper, titanium, tantulum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. The mask layer may be formed of, for example, silicon nitride or the like.

Figure 3:
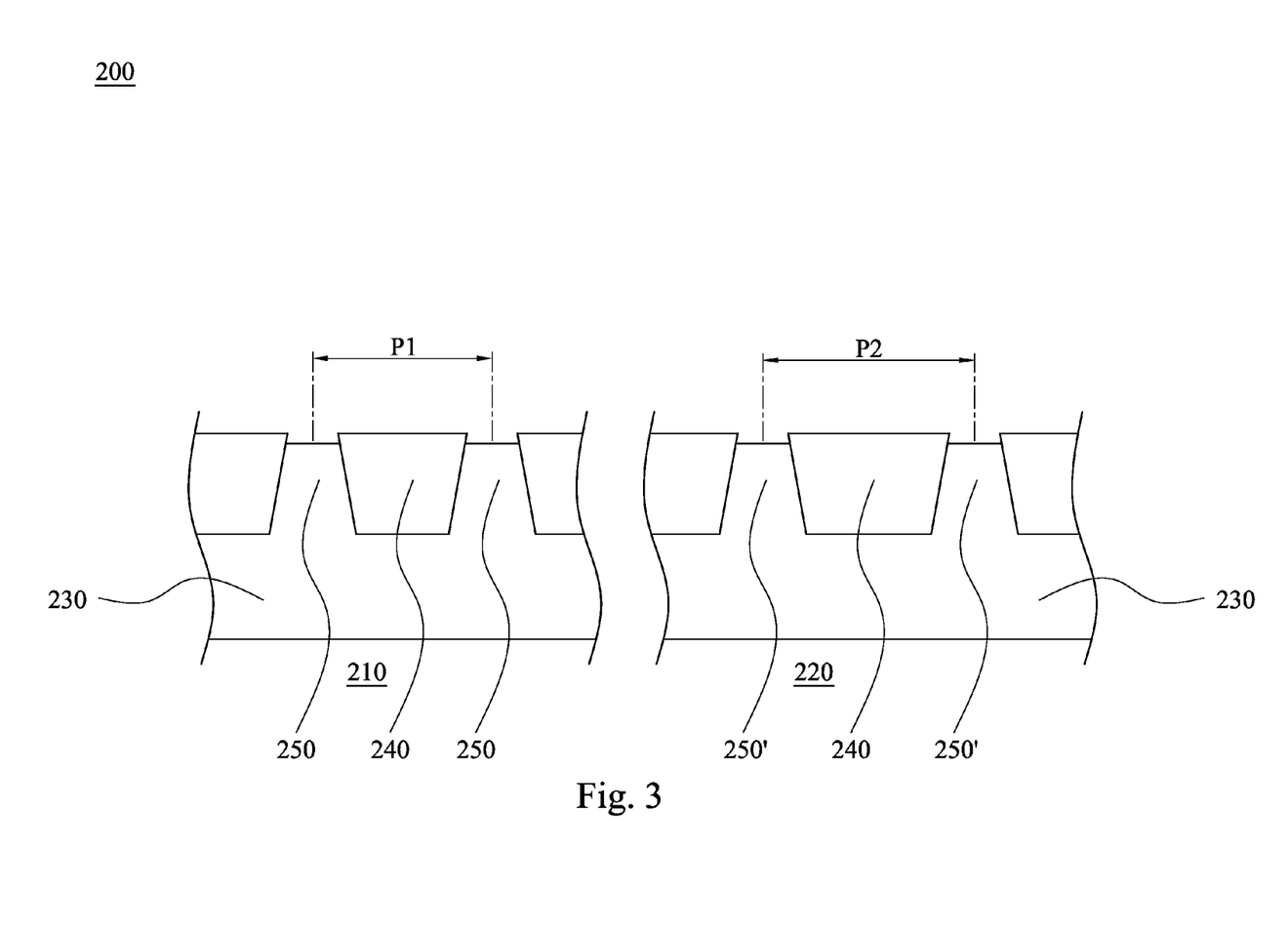

Following the formation of the gate structure, strained source/drain (S/D) regions are formed. To do so, the fin structures 250, 250' at the predetermined S/D regions are first partially removed as illustrated in FIG. 3. Any suitable amount of material may be removed. However, the amount removed has an effect on the presence of stress in the source/drain regions that will be formed later. Thus, the depth can be tailored to create or remove desired stress effects and dislocations within the S/D regions and to control other characteristics of the device channel.

Removing a portion of the fin structure 204 may include forming a photoresist layer or a capping layer (such as an oxide capping layer) over the substrate, patterning the photoresist or capping layer to have openings that expose the S/D regions of the fin structures 250, 250', and etching back material from the fin structure 250, 250'. In the depicted embodiment, the fin structures 250, 250' are etched by a dry etching process. Alternatively, the etching process is a wet etching process, or combination dry and wet etching process. Removal may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet another alternative, the lithography process could implement nanoimprint technology.

Figure 4:
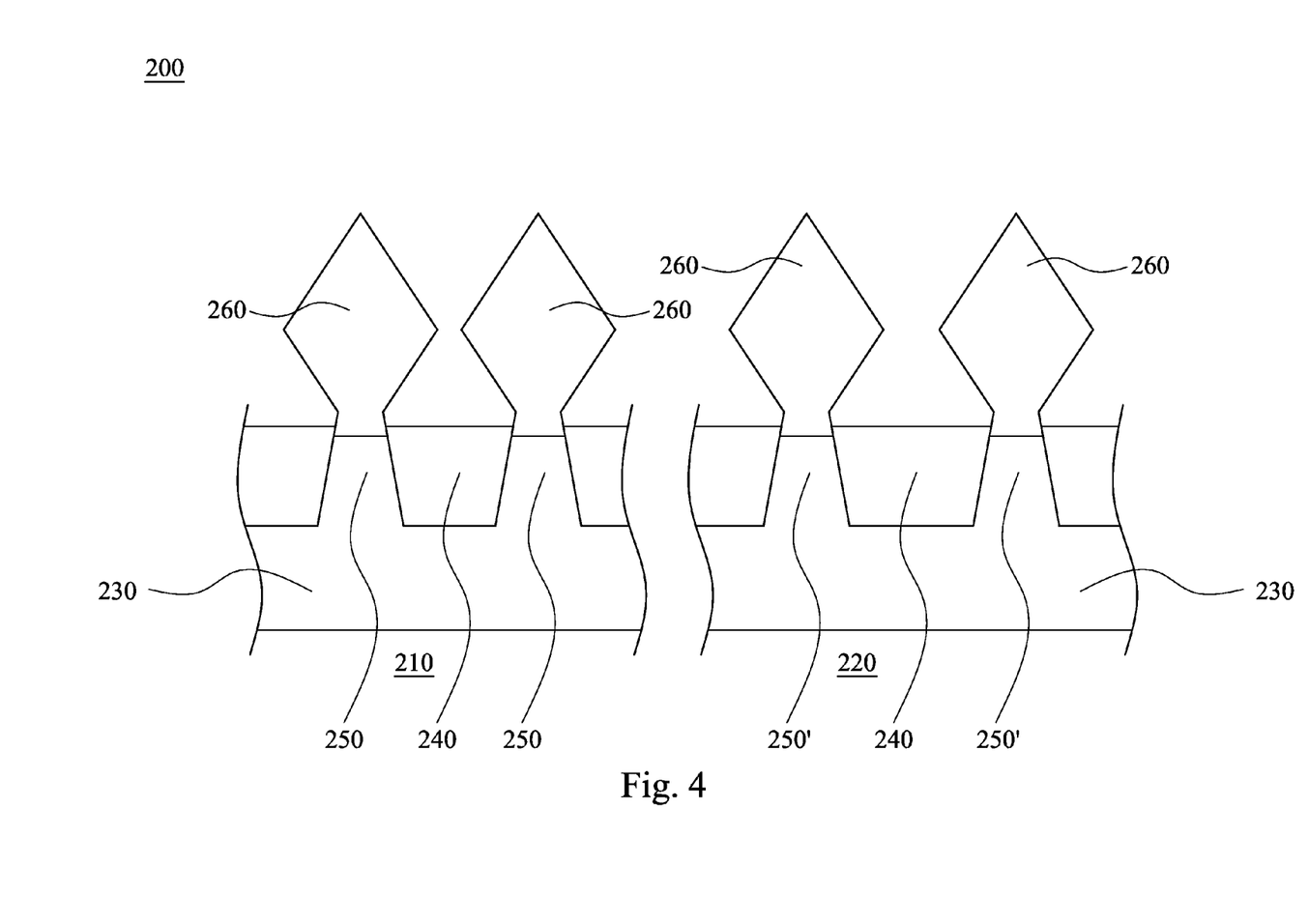

FIG. 4 illustrates the formation of the first strained materials 260 (e.g. a SiGe layer) on the fin structures 250, 250' by one or more epitaxy or epitaxial (epi) processes (step 130). In some embodiments, a plurality of first strained materials 260 disposed on each of the plurality of the fin structures 250, 250'. Some exemplary first strained materials may be formed of a material selected from the group consisting of silicon germanium (SiGe), silicon carbon (SiC), and carbon-doped silicon germanium, or combinations thereof. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors. Thus, a strained channel can be achieved to increase carrier mobility and enhance device performance. The first strained materials 260 may be in-situ doped. The doping species include p-type dopants, such as boron or $BF_2$; n-type dopants, such as phosphorus or arsenic; and/or other suitable dopants including combinations thereof. If the first strained materials 260 are not in-situ doped, a second implantation process (i.e., a junction implant process) is performed. One or more annealing processes may be performed to activate the dopants. The annealing processes comprise rapid thermal annealing (RTA) and/or laser annealing processes. In some embodiments, the plurality of the first strained materials 260 may have a diamond shape having a height of 20-60 nm, 30-60 nm, or 30-50 nm.

Figure 5:
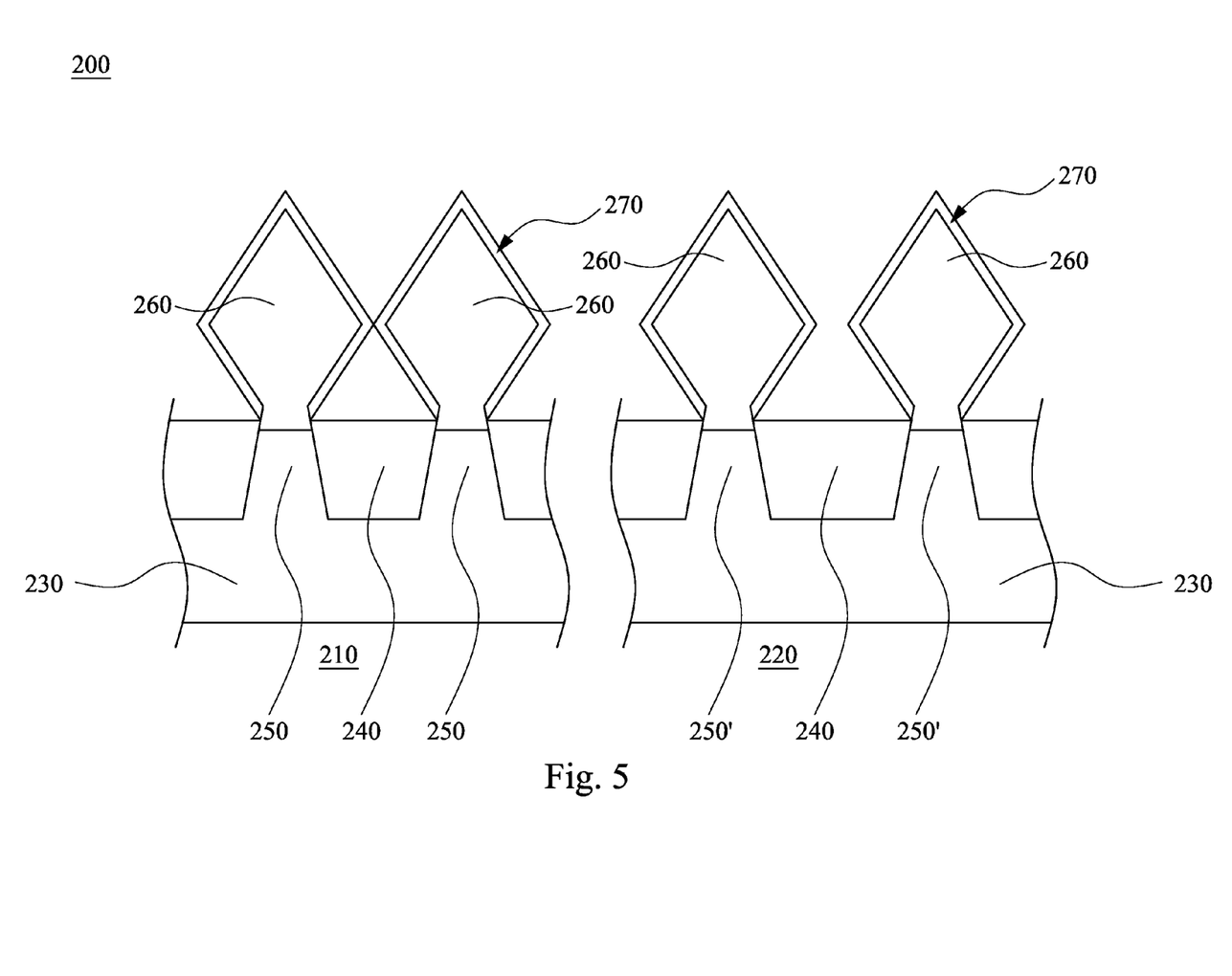

FIG. 5 illustrates the formation of cap layers 270 (step 140) individually on each of the plurality of first strained materials 260. Specifically, the cap layers 270 are conformally formed on each of the plurality of first strained materials over the fin structures 250, 250' respectively. As illustrated in FIG. 5, in some embodiments, at least two cap layers 270 on the first strained materials 260 are formed to a thickness sufficient to connect to each other at the first region 210 but not so thick as to connect to each other at the second region. That is, at least two cap layers at the first region is connected to each other, while each of the cap layers 270 at the second region 270 is spaced apart from each other. The thickness of the cap layers 270 may be, for example, 1-20 nm, 1-10 nm, or 5-10 nm. In some embodiment, the cap layer 270 is formed of the same material as the first strained material 260. In other embodiment, the cap layer 270 is formed a different material from the first strained material 260. Exemplary cap layers 270 may be formed of doped silicon selected from the group consisting of silicon germanium (SiGe), silicon carbon (SiC), and carbon-doped silicon germanium, or combinations thereof.

FIG. 6 is a cross-sectional view of aspect of semiconductor device in accordance with some embodiments of the present disclosure, further illustrating the formation of the second strained materials 280, 280' (e.g. a SiGe layer) on the cap layers (step 150). Due to the connection of the cap layers 270, the second strained material 280 at the first region 210 is grown to a lager volume than the second strained material 280' at the second region 220. As illustrated in FIG. 6, in some embodiments, the second strained material 280 at the first region 210 has a bulk volume formed between two adjacent first strained materials 260, while the second strained material 280' at the second region 220 is only conformally formed as a thin film on the cap layer 270. More specifically, the second strained material 280 at the first region 210 is formed between upper portions of two adjacent diamond-shaped first strained materials 260. In addition, the exemplary second strained material 280 at the first region 210 does not formed at a space between lower portions of two adjacent diamond-shaped first strained materials 260. Some exemplary second strained materials 280, 280' may be formed of a material selected from the group consisting of silicon germanium (SiGe), silicon carbon (SiC), and carbon-doped silicon germanium, or combinations thereof. Exemplary second strained materials may be formed by one or more epitaxy processes as described above. In some embodiments, exemplary first and second strained materials 260 and 280 may be formed with a germanium (Ge) concentration of 35% to 70%, which is greater than that of the cap layers 270. In some embodiments, the second strained material 280 at the first region 210 may have a height of 10-60 nm, 15-50 nm, or 15-30 nm. In some embodiments, the second strained material 280 has a top surface at least level with or higher that the top of the cap layers 270.

According to some embodiments of the present disclosure, in the first region 210 containing a plurality of first fin structures 240, strained materials 260, 280 are grown to an increased volume to achieve tensile strain enhancement in the first region, thereby increasing charge mobility through the channel. This leads to dramatic improvements in device performance. The semiconductor having increased strained material volume demonstrates higher drive strength for a given channel size and supply voltage. On the other hand, the volume of the second strained material 280' at the second region 220 is suppressed. Accordingly, the device performance of the first region 210 (device region) can be improved without compromising the product yield of the second region 220 (memory region).

Accordingly, exemplary semiconductor device 200 of the present disclosure is obtained, and it may at least includes a substrate 230; a plurality of fin structures 240 disposed on the substrate 230; a plurality of first strained materials 260 disposed on each of the plurality of the fin structures 250; a plurality of cap layers 270 individually formed on each of the plurality of first strained materials 260, wherein at least two cap layers 270 are connected to each other; and a second strained material 280 disposed on the at least two cap layers 270 which are connected to each other, as shown in FIG. 5. Subsequently, additionally features such as interlayer dielectric, interconnection, and so on may be formed using conventional process steps to complete the fabrication of the semiconductor device 200, which will not be described here for brevity.

FIG. 7 is a cross-sectional view of aspect of semiconductor device in accordance with another embodiment of the present disclosure, where components and features similar to those of the previous embodiment are identified with the same or similar reference numerals. This embodiment is substantially the same as the previous embodiment, except that more than two cap layers 270 (e.g. four cap layers in the exemplary figure) on the first strained materials 260 are connected to one another at the first region, while the cap layers are spaced apart from one another at the second region. In addition, according to some embodiments, the second strained materials 280' at the second region 220 are conformally formed on each of the plurality of cap layers 270 respectively. Details regarding this embodiment that are similar to those for the previously described embodiment will not be repeated herein. Subsequently, additionally features such as interlayer dielectric, interconnection, and so on may be formed using conventional process steps to complete the fabrication of the semiconductor device 200, which will not be described here for brevity.

As illustrated in the embodiment of FIG. 7, the second strained material 280 at the first region 210 is formed to span over a plurality of connected cap layers 270, first strained materials 270 and fin structures 250. The second strained material 280 at the first region 210 may be formed to a height of 10-60 nm, 15-50 nm, or 15-30 nm. In some embodiments, the second strained material 280 has a top surface at least level with or higher that the top of the cap layers 270. In some embodiments, exemplary second strained materials 280' at the second region 210 are conformally formed on each of the plurality of cap layers 270 respectively to a thickness of 0.1-20 nm, 0.1-10 nm, 1-10 nm, or 0.5 nm-10 nm.

Although not explicitly shown, a person having ordinary skill in the art will readily understand that further processing steps may be performed on the structure in FIGS. 6 and 7. For example, various inter-metal dielectrics (IMD) and their corresponding metallizations may be formed over ILD 98. Further, contacts to the gate electrode 108 may be formed through overlying dielectric layers.

Embodiments may achieve advantages. For example, the present disclosure is a semiconductor device and method of forming the same to provide a simple and cost-effective process flow to achieve a strained material, and the stress effects improve charge mobility through the channel, thereby improving device performance. In addition, embodiments such as those disclosed above include an increased volume of strained material for a semiconductor device to achieve performance improvements and enhancements. For example, in first region containing a plurality of first fin structures, such as a metal-oxide-semiconductor field effect transistor (MOSFET), the epitaxial strained material (e.g. SiGe layers) is grown to an increased volume to achieve tensile strain enhancement in the first region, while in a second region containing a plurality of second fin structures having a second pitch great than a first pitch of the first fin structures, such as a static random-access memory (SRAM), the epitaxial strained materials (e.g. SiGe layer) is grown to an desired volume but maintain spaced apart from one another.

An embodiment is a semiconductor device, comprising: a substrate; a plurality of fin structures disposed on the substrate; a plurality of first strained materials disposed on each of the plurality of the fin structures; a plurality of cap layers individually formed on each of the plurality of first strained materials, wherein at least two cap layers are connected to each other; and a second strained material disposed on the at least two cap layers which are connected to each other. The plurality of the first strained materials may have a diamond shape. In other words, the second strained material is formed between upper portions of two adjacent diamond-shaped first strained materials, and the second strained material does not formed at a space between lower portions of two adjacent diamond-shaped first strained materials. Specifically, the plurality of cap layers are conformally formed on each of the plurality of first strained materials respectively. In addition, the first strained material and the second strained material are independently formed of a material selected from the group consisting of silicon germanium (SiGe), silicon carbon (SiC), and carbon-doped silicon germanium, or combinations thereof, and the cap layers are formed of a material selected from the group consisting of silicon germanium (SiGe), silicon carbon (SiC), and carbon-doped silicon germanium, or combinations thereof.

Another embodiment is a method for fabricating a semiconductor device, comprising: providing a substrate; forming a plurality of fin structures on the substrate; forming a plurality of first strained materials individually on each of the plurality of the fin structures; forming a plurality of cap layers individually on each of the plurality of first strained materials, wherein at least two cap layers on the first strained materials are formed to a thickness sufficient to connect to each other; and forming a second strained material on the at least two cap layers which are connected to each other. The plurality of the first strained materials have a diamond shape. The second strained material is formed between two adjacent first strained materials. In other words, the second strained material is formed between upper portions of two adjacent diamond-shaped first strained materials, while the second strained material does not formed at a space between lower portions of two adjacent diamond-shaped first strained materials. Specifically, the plurality of cap layers are conformally formed on each of the plurality of first strained materials respectively. In addition, the first strained material and the second strained material are independently formed of a material selected from the group consisting of silicon germanium (SiGe), silicon carbon (SiC), and carbon-doped silicon germanium, or combinations thereof, and the cap layers are formed of a doped silicon selected from the group consisting of silicon germanium (SiGe), silicon carbon (SiC), and carbon-doped silicon germanium, or combinations thereof.

A further embodiment is a semiconductor device, comprising: a substrate; a plurality of first fin structures disposed on a first region of the substrate, and a plurality of second fin structures disposed on a second region of the substrate, wherein a first pitch of the first fin structures is less than a second pitch of the second fin structures; a plurality of first strained materials individually disposed on each of the plurality of the first fin structures and each of the plurality of the second fin structures; a plurality of cap layers individually disposed on each of the plurality of first strained materials, wherein the cap layers are connected to one another at the first region; and a plurality of second strained materials disposed on the plurality of cap layers. In particular, the plurality of the first strained materials have a diamond shape, and the second strained material at the first region is built up between upper portions of two adjacent diamond-shaped first strained materials. Specifically, the cap layers are conformally formed on each of the plurality of first strained materials respectively. In addition, the second strained materials at the second region are conformally formed on each of the plurality of cap layers respectively. Furthermore, the cap layers are spaced apart from one another at the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a plurality of fin structures disposed on the substrate;
   a plurality of first strained materials disposed on each of the plurality of the fin structures;
   a plurality of cap layers individually formed on each of the plurality of first strained materials, wherein at least two cap layers are connected to each other; and
   a second strained material disposed on the at least two cap layers which are connected to each other.

2. The semiconductor device of claim 1, wherein the plurality of the first strained materials have a diamond shape.

3. The semiconductor device of claim 2, wherein the second strained material is formed between upper portions of two adjacent diamond-shaped first strained materials.

4. The semiconductor device of claim 2, wherein the second strained material does not formed at a space between lower portions of two adjacent diamond-shaped first strained materials.

5. The semiconductor device of claim 1, wherein the plurality of cap layers are conformally formed on each of the plurality of first strained materials respectively.

6. The semiconductor device of claim 1, wherein the first strained material and the second strained material are independently formed of a material selected from the group consisting of silicon germanium (SiGe), silicon carbon (SiC), and carbon-doped silicon germanium, or combinations thereof.

7. The semiconductor device of claim 1, wherein the cap layers are formed of a material selected from the group consisting of silicon germanium (SiGe), silicon carbon (SiC), and carbon-doped silicon germanium, or combinations thereof.

8. A method for fabricating a semiconductor device, comprising:
   forming a plurality of fin structures on a substrate;
   forming a plurality of first strained materials individually on each of the plurality of the fin structures;
   forming a plurality of cap layers individually on each of the plurality of first strained materials, wherein at least two cap layers on the first strained materials are formed to a thickness sufficient to connect to each other; and
   forming a second strained material on the at least two cap layers which are connected to each other.

9. The method of claim 8, wherein the plurality of the first strained materials have a diamond shape.

10. The method of claim 9, wherein the second strained material is formed between upper portions of two adjacent diamond-shaped first strained materials.

11. The s method of claim 9, wherein the second strained material does not formed at a space between lower portions of two adjacent diamond-shaped first strained materials.

12. The method of claim 8, wherein the plurality of cap layers are conformally formed on each of the plurality of first strained materials respectively.

13. The method of claim 8, wherein the first strained material and the second strained material are independently formed of a material selected from the group consisting of silicon germanium (SiGe), silicon carbon (SiC), and carbon-doped silicon germanium, or combinations thereof, and the cap layers are formed of a doped silicon selected from the group consisting of silicon germanium (SiGe), silicon carbon (SiC), and carbon-doped silicon germanium, or combinations thereof.

14. The method of claim 8, wherein the second strained material is formed between two adjacent first strained materials.

15. A semiconductor device, comprising:
   a substrate;
   a plurality of first fin structures disposed on a first region of the substrate, and a plurality of second fin structures disposed on a second region of the substrate, wherein a first pitch of the first fin structures is less than a second pitch of the second fin structures;
   a plurality of first strained materials individually disposed on each of the plurality of the first fin structures and each of the plurality of the second fin structures;
   a plurality of cap layers individually disposed on each of the plurality of first strained materials, wherein the cap layers are connected to one another at the first region; and a plurality of second strained materials disposed on the plurality of cap layers.

16. The semiconductor device of claim 15, wherein the plurality of the first strained materials have a diamond shape.

17. The semiconductor device of claim 16, wherein the second strained material at the first region is built up between upper portions of two adjacent diamond-shaped first strained materials.

18. The semiconductor device of claim 15, wherein the cap layers are spaced apart from one another at the second region.

19. The semiconductor device of claim 15, wherein the cap layers are conformally formed on each of the plurality of first strained materials respectively.

20. The semiconductor device of claim 15, wherein the second strained materials at the second region are conformally formed on each of the plurality of cap layers respectively.

* * * * *